United States Patent
Kidokoro et al.

(10) Patent No.: US 7,170,087 B2
(45) Date of Patent: Jan. 30, 2007

(54) EL DEVICE AND METHOD FOR MANUFACTURING THE SAME

(75) Inventors: Atsushi Kidokoro, Aichi-ken (JP); Ryouichi Tomida, Aichi-ken (JP); Kazuyoshi Takeuchi, Aichi-ken (JP)

(73) Assignee: Kabushiki Kaisha Toyota Jidoshokki, Kariya (JP)

( * ) Notice: Subject to any disclaimer, the term of this patent is extended or adjusted under 35 U.S.C. 154(b) by 0 days.

(21) Appl. No.: 10/891,631

(22) Filed: Jul. 15, 2004

(65) Prior Publication Data

US 2005/0026316 A1    Feb. 3, 2005

(30) Foreign Application Priority Data

Aug. 1, 2003    (JP)    ............... 2003-205481

(51) Int. Cl.
- H01L 29/08    (2006.01)
- H01L 35/24    (2006.01)
- H01L 51/00    (2006.01)

(52) U.S. Cl. .............. 257/40; 257/59; 257/72; 257/E27.111

(58) Field of Classification Search ......... 257/40, 257/100, 72, 59, E51.02, E27.111
See application file for complete search history.

(56) References Cited

U.S. PATENT DOCUMENTS

| | | | |
|---|---|---|---|
| 6,198,217 B1 * | 3/2001 | Suzuki et al. ............. | 313/504 |
| 6,781,148 B2 * | 8/2004 | Kubota et al. ............. | 257/40 |
| 6,897,474 B2 * | 5/2005 | Brown et al. .............. | 257/40 |
| 6,936,912 B2 * | 8/2005 | Akiyama et al. ........... | 257/676 |
| 6,985,275 B2 * | 1/2006 | Miyazawa ................. | 359/245 |
| 7,012,363 B2 * | 3/2006 | Weaver et al. ............. | 313/504 |
| 2002/0153523 A1 * | 10/2002 | Bernius et al. ............ | 257/40 |
| 2004/0105047 A1 * | 6/2004 | Kato ....................... | 349/69 |
| 2004/0124766 A1 * | 7/2004 | Nakagawa et al. ......... | 313/504 |
| 2004/0247938 A1 * | 12/2004 | Yamaguchi et al. ........ | 428/690 |
| 2005/0007518 A1 * | 1/2005 | Kato ....................... | 349/69 |
| 2005/0017633 A1 * | 1/2005 | Miyadera .................. | 313/512 |

FOREIGN PATENT DOCUMENTS

| | | |
|---|---|---|
| JP | 7-61474 | 6/1995 |
| JP | 08236274 A * | 9/1996 |
| JP | 2002-222691 | 8/2002 |
| JP | 2003-118030 | 4/2003 |
| JP | 2003-133063 | 5/2003 |
| KR | 2003-0008818 | 1/2003 |

* cited by examiner

Primary Examiner—B. William Baumeister
Assistant Examiner—Igwe U. Anya
(74) Attorney, Agent, or Firm—Morgan & Finnegan, L.L.P.

(57) ABSTRACT

Formed on a glass substrate is an EL element including an anode, an organic light emitting layer, and a cathode. A first protective film is formed on a surface of the EL element to cover the EL element through a dry process. A second protective film is then formed on a surface of the first protective film to cover the first protective film by using polysilazane through a wet process. Even if an uncovered portion is left in the first protective film owing to the existence of a foreign matter thereon, the second protective film covers the uncovered portion to avoid intrusion of oxygen or other gases, moisture, etc. into the EL element from the outside.

11 Claims, 2 Drawing Sheets

EL DEVICE AND METHOD FOR MANUFACTURING THE SAME

BACKGROUND OF THE INVENTION

1. Field of the Invention

The present invention relates to an electroluminescence (EL) device, in particular, an improvement in moisture and gas resistance.

The present invention also relates to a method for manufacturing such an EL device.

2. Description of the Related Art

Up to now, EL devices, for example, inorganic or organic EL devices have been widely put into practical use as displays for thin, lightweight portable devices or illuminators on account of being self-luminous and capable of providing a high-luminance screen. The EL device has a structure in which an EL element is formed on a substrate, the EL element having a pair of electrode layers, at least one of which constitutes a transparent electrode, and a light emitting layer interposed between the electrode layers.

As regards this type of EL device, there is a possibility that the light emitting layer or the electrode layer of the EL element is damaged by intrusion of oxygen or other gases, moisture, etc. to deteriorate an image quality or shorten a lifetime. To cope with this, it has been proposed to cover the surface of the EL element with a protective film for avoiding the intrusion of oxygen or other gases, moisture, etc. from the outside.

For example, JP 2002-222691 A discloses a technique for applying polysilazane to the surface of an EL element to form a silica film or silica-based film as a protective film. In addition, JP 3170542 B discloses an organic EL element on the surface of which an inorganic amorphous film selected from the group consisting of an $\alpha$-Si film, an $\alpha$-SiC film, an $\alpha$-SiN film, and an $\alpha$-C film is formed as a protective film by plasma CVD and the like methods.

Further, JP 2003-118030 A discloses an EL device prepared by forming a gas barrier layer on the surface of an organic base material through a dry process and in addition, forming a cured substance layer made of a cured substance of a polysilazane-containing composition on the surface of the gas barrier layer through a wet process, and arranging the base material on the surface of the EL element.

However, if aiming at directly applying polysilazane onto the surface of the EL element to form a silica film etc. as proposed in JP 2002-222691 A, an electrode layer or light emitting layer of the EL element is in danger of being damaged by a solvent in the applied polysilazane solution. In the case of forming a film by plasma CVD etc. as proposed in JP 3170542 B, the film formed through the plasma CVD is limited of its throwing power. For example, if foreign matters exist on the surface of the EL element, the foreign matters cannot be completely covered with an inorganic amorphous film and uncovered portions may allow the intrusion of oxygen or other gases, moisture, etc. Such intrusion of oxygen or other gases, moisture, etc. in the EL element induces deterioration of the light emitting layer, causing dark spots that may grow as time goes by.

Further, assuming that the gas barrier layer and the cured substance layer are formed on the surface of the organic base material and the base material is arranged on the surface of the EL element as proposed in JP 2003-118030 A, the following problems arise. That is, the above arrangement complicates a structure of the EL device with a larger thickness as well as a manufacturing process therefor.

SUMMARY OF THE INVENTION

The present invention has been made with a view to solving the aforementioned problems inherent in the conventional techniques and therefore has an object to provide an EL device capable of avoiding any deterioration caused by intrusion of oxygen or other gases, moisture, etc., despite its simple structure, without damaging an EL element.

It is another object of the present invention to provide a method for manufacturing such an EL device.

An EL device according to the present invention includes: a substrate; an EL element formed on a surface of the substrate and including at least a first electrode layer, a light emitting layer, and a second electrode layer; a first protective film formed on a surface of the EL element to cover the EL element through a dry process; and a second protective film formed on a surface of the first protective film through a wet process and adapted to cover an uncovered portion by the first protective film.

A method for manufacturing an EL device according to the present invention includes the steps of: forming an EL element including at least a first electrode layer, a light emitting layer, and a second electrode layer on a surface of a substrate; forming a first protective film on a surface of the EL element to cover the EL element through a dry process; and depositing polysilazane on the first protective film through a wet process to form a second protective film.

More specifically, the first protective film is directly formed on the surface of the EL element through the dry process and the second protective film is further formed on the first protective film by using polysilazane through the wet process. The first and second protective films thus formed can prevent the EL element from deteriorating owing to the intrusion of oxygen or other gases, moisture, etc. without damaging the EL element.

DETAILED DESCRIPTION OF THE PREFERRED EMBODIMENT

Hereinafter, an embodiment of the present invention will be described with reference to the accompanying drawings.

Figure 1:
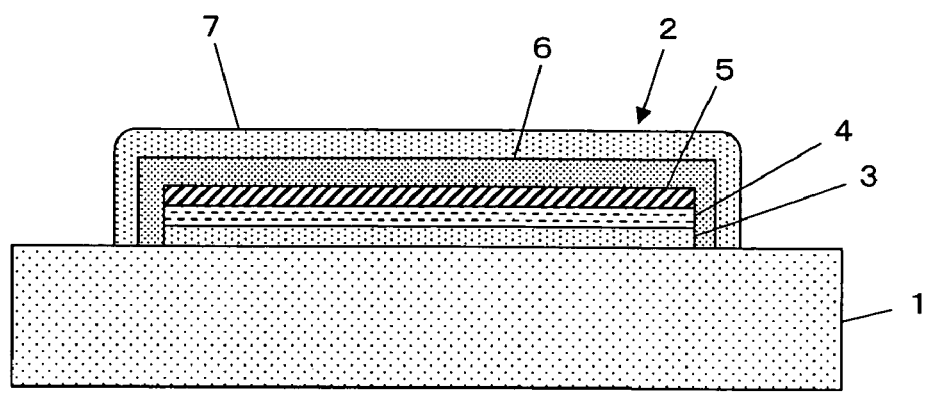
FIG. 1 is a sectional view showing a structure of an EL device according to an embodiment of the present invention.

FIG. 1 shows a section of an EL device according to the embodiment of the present invention. An EL element 2 is formed on a transparent glass substrate 1. The EL element 2 includes: an anode 3 serving as a first electrode layer and formed on the surface of the glass substrate 1; an organic light emitting layer 4 formed on the anode 3; and a cathode 5 serving as a second electrode layer and formed on the organic light emitting layer 4. A first protective film 6 is formed on the surface of the EL element 2 to cover the element 2. A second protective film 7 is further formed on the surface of the first protective film 6 to cover the film 6.

The glass substrate 1 may be formed of any material transmissive or semi-transmissive against visible light. In addition to glass, a plastic satisfying such a condition may be used. The anode 3 of the EL element 2 has only to be transmissive or semi-transmissive against at least visible light while functioning as an electrode. For example, ITO is used as a material therefor. The organic light emitting layer 4 is made of a material containing at least any known organic light emitting substance such as $Alq_3$ or DCM. One or more layers such as an electron transporting layer and a hole transporting layer may be formed between the electrodes as appropriate, the layers being used in conventional organic EL devices. The respective layers are appropriately formed of any known material. The cathode 5 has only to function as an electrode as well as exhibit a reflectivity against at least visible light. For example, metal such as Al, Cr, or Mo, an Al alloy, or an Al/Mo laminate can be used therefor. Each layer may be formed by any known thin film formation method, e.g., vacuum deposition.

The first protective film 6 is formed of an Si compound prepared through a dry process, for example, silicon nitride, silicon oxynitride, and silicon oxide, with a thickness of, preferably, 0.1 to 5 μm.

Further, used as the second protective film 7 is an $SiO_2$ film having a thickness of 0.01 to 2 μm and prepared by using polysilazane through a wet process. In this specification, the term "polysilazane" covers a derivative of polysilazane, where hydrogen atoms bonded to Si atoms are partially replaced with alkyl groups etc. In the presence of the alkyl group, in particular, a methyl group with a low-molecular weight, the $SiO_2$ film improves its adhesion to the first protective film to be a base and exhibits flexibility. As a result, cracks can be prevented from developing even if the $SiO_2$ film is made thick. As regards the alkyl group, it is preferable to adopt an alkyl group having 1 to 4 carbon atoms. Also, the polysilazane may be in a semidry state where a portion thereof remains unreacted.

In the EL device thus structured, a light emitting surface corresponds to a principle surface of the glass substrate 1 opposite to another principle surface having the EL element 2 formed thereon. That is, the light emitted from the organic light emitting layer 4 directly enters the anode 3 or indirectly enters there after being reflected by the cathode 5 and then, passes through the glass substrate 1 and outgoes therefrom.

Next, a method for manufacturing the aforementioned EL device will be discussed. First, the anode 3, the organic light emitting layer 4, and the cathode 5 are stacked on the surface of the glass substrate 1 in the stated order by any known thin film formation method such as vacuum deposition to thereby form the EL element 2.

After that, the glass substrate 1 with the EL element 2 is transferred into a chamber of a plasma CVD apparatus in a vacuum or in an inert atmosphere. The first protective film 6 is formed on the surface of the cathode 5 by plasma CVD. At this time, it is preferable to form the first protective film 6 under such conditions that a temperature of the glass substrate 1 falls within a temperature range not higher than glass transition temperatures of each material forming the EL element 2, for example, 50 to 110° C., so as not to affect the EL element 2. More preferably, the temperature of the glass substrate 1 falls within such a temperature range as is 20 K. or less below the lowest one of the glass transition temperatures of each material forming the EL element 2.

Next, it is exposed to the atmosphere, followed by applying polysilazane onto the surface of the first protective film 6. A coating method may be selected from various methods such as spin coating, dip coating, flow coating, roll coating, and screen printing. Here, polysilazane may be applied in the same atmosphere as when the first protective film 6 is formed or in an inert atmosphere instead of exposure to the atmosphere.

Following this, polysilazane is baked by use of an oven, a hot plate, or such other heaters to start reaction as represented by the following reaction formula to form the second protective film 7:

Thus, the EL device is completed.

Figure 2:
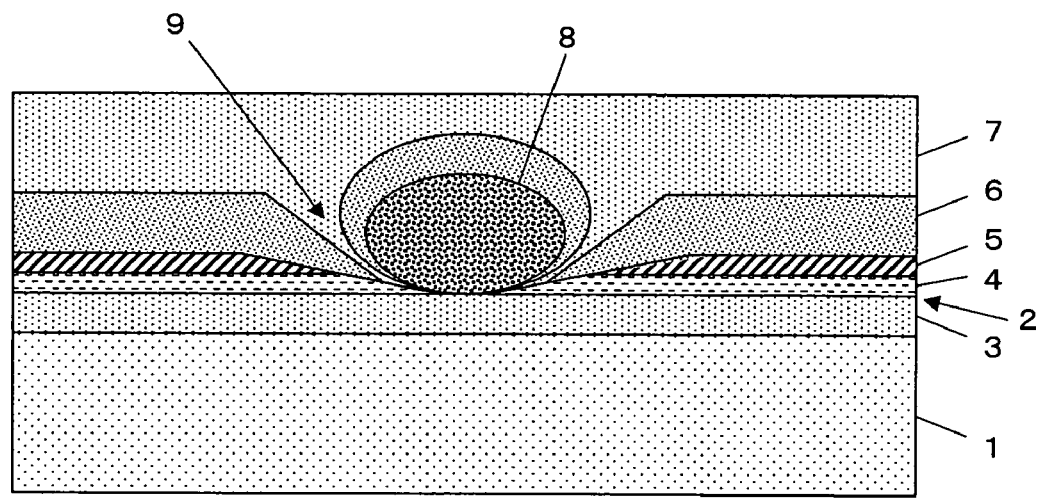
FIG. 2 is an enlarged sectional view showing a main part of an EL device in the case where foreign matter exists on an EL element.

As shown in FIG. 2, if a foreign matter 8 such as dust exists on the surface of the EL element 2, for instance, there is a possibility that, even though the first protective film 6 is formed on the surface of the EL element 2 through the dry process, the film 6 fails to completely cover the foreign matter 8 to leave an uncovered portion 9 by the first protective film 6. However, the second protective film 7 is formed on the first protective film 6 through the wet process to thereby cover the uncovered portion 9 by the first protective film 6. Accordingly, it is possible to avoid the intrusion of oxygen or other gases, moisture, etc. into the EL element 2 from the outside.

Also, the first protective film 6 is formed on the surface of the EL element 2 through the dry process before polysilazane is applied onto the first protective film 6 to form the second protective film 7. Hence, the EL element 2 is free of any damage.

The foreign matter 8 can be glass powder or resist deposit, in addition to the dust. Whatever the foreign matter may be, the uncovered portion 9 by the first protective film 6 is covered with the second protective film 7, making it possible to avoid the intrusion of oxygen or other gases, moisture, etc.

If a portion of the applied polysilazane remains unreacted in the baking process, that is, the polysilazane is kept in a semidry state, the unreacted portion reacts with intruding moisture to thereby keep the intruding moisture from reaching the EL element 2. Hence, the EL element 2 can be prevented from deteriorating owing to the intruding moisture.

Note that a bottom-emission type organic EL device has been discussed in the above embodiment, in which the transparent anode 3, the organic light emitting layer 4, and the reflective cathode 5 are stacked in the stated order on the glass substrate 1 and the light emitted from the organic light emitting layer 4 is transmitted through the anode 3 and the glass substrate 1 to outgo therefrom. However, the present invention is not limited to this. The present invention is applicable to a top-emission type organic EL device where a reflective electrode, an organic light emitting layer, and a transparent electrode are stacked in the stated order on a substrate and the light emitted from the organic light emitting layer is transmitted through the transparent electrode opposite to the substrate to outgo therefrom. In this case, the first and second protective films are sequentially formed on the transparent electrode and need to be formed of a material transmissive or semi-transmissive against the visible light.

A description has been made of the organic EL device so far. However, the present invention is similarly applicable to an inorganic EL device.

As a wet process for forming the second protective film, a method of applying a moisture-resistant resin may be employed except the method of applying polysilazane.

EXAMPLE

An anode ITO was formed with a thickness of 190 nm on a transparent glass substrate by reactive sputtering. Thereafter, the substrate was subjected to alkali-washing prior to deposition of the light emitting layer and then washed with pure water, followed by drying and UV ozone cleaning.

The substrate was transferred to a vacuum deposition apparatus where copper phthalocyanine was deposited as a hole injecting region with a thickness of 10 nm on the surface of the anode by using a carbon crucible at a deposition rate of 0.1 nm/sec and a degree of vacuum of about $5.0 \times 10^{-5}$ Pa.

Next, a tetramer of triphenylamine was deposited as a hole transporting region with a thickness of 30 nm on the hole injecting region by using a carbon crucible at a deposition rate of 0.1 nm/sec and a degree of vacuum of about $5.0 \times 10^{-5}$ Pa.

Further, 4,4'-bis(2,2-diphenylvinyl)biphenyl (DPVBi) (emitted light color: blue) was deposited as a light emitting region with a thickness of 30 nm on the hole transporting region at a deposition rate of 0.1 nm/sec and a degree of vacuum of about $5.0 \times 10^{-5}$ Pa.

A quinolinolato metal complex, $Alq_3$, was deposited as an electron transporting region with a thickness of 20 nm on the light emitting region by using a carbon crucible at a deposition rate of 0.01 nm/sec and a degree of vacuum of about $5.0 \times 10^{-5}$ Pa.

Following this, lithium fluoride (LiF) was deposited as a cathode interface region with a thickness of 0.5 nm on the electron transporting region by using a carbon crucible at a deposition rate of 0.03 nm/sec and a degree of vacuum of about $5.0 \times 10^{-5}$ Pa. Further, on the cathode interface region, aluminum was deposited on a tungsten boat as a cathode with a thickness of 100 nm at a deposition rate of 1 nm/sec and a degree of vacuum of about $5.0 \times 10^{-5}$ Pa.

After the EL element was thus formed on the glass substrate, a silicon nitride film was formed as the first protective film on the surface of the cathode by a plasma CVD apparatus. More specifically, the glass substrate was placed in a chamber of the plasma CVD apparatus to evacuate the chamber down to a pressure of $1 \times 10^{-3}$ Pa to allow $SiH_4$, $NH_3$, and $N_2$ to flow therein at flow rates of 100 ml/min, 50 ml/min, and 1,000 ml/min, respectively. At this point, a pressure was adjusted to 75 Pa. Next, an RF power of 13.56 MHz, 600 W was applied between a pair of electrodes disposed with a gap of 20 mm to induce gas discharge, by which a 1 μm-thick silicon nitride film was deposited on the surface of the cathode. At this time, the glass substrate temperature was set to 100° C. or lower and a film formation rate was about 3 nm/sec.

Further, the surface of the silicon nitride film was coated with polysilazane ("NL-120" available from Clariant (Japan) KK.) in a concentration of 20 wt % by using a spinner having a rotation speed of 500 rpm. Subsequently, the resultant was dried on a hot plate at 90° C. for 30 minutes to thereby form the second protective film with a thickness of 0.5 μm.

An evaluation was made of the EL device thus manufactured under high temperature/high humidity conditions. Consequently, the evaluation confirms that no dark spot develops on a screen even after the elapse of 500 hours.

Figure 3:
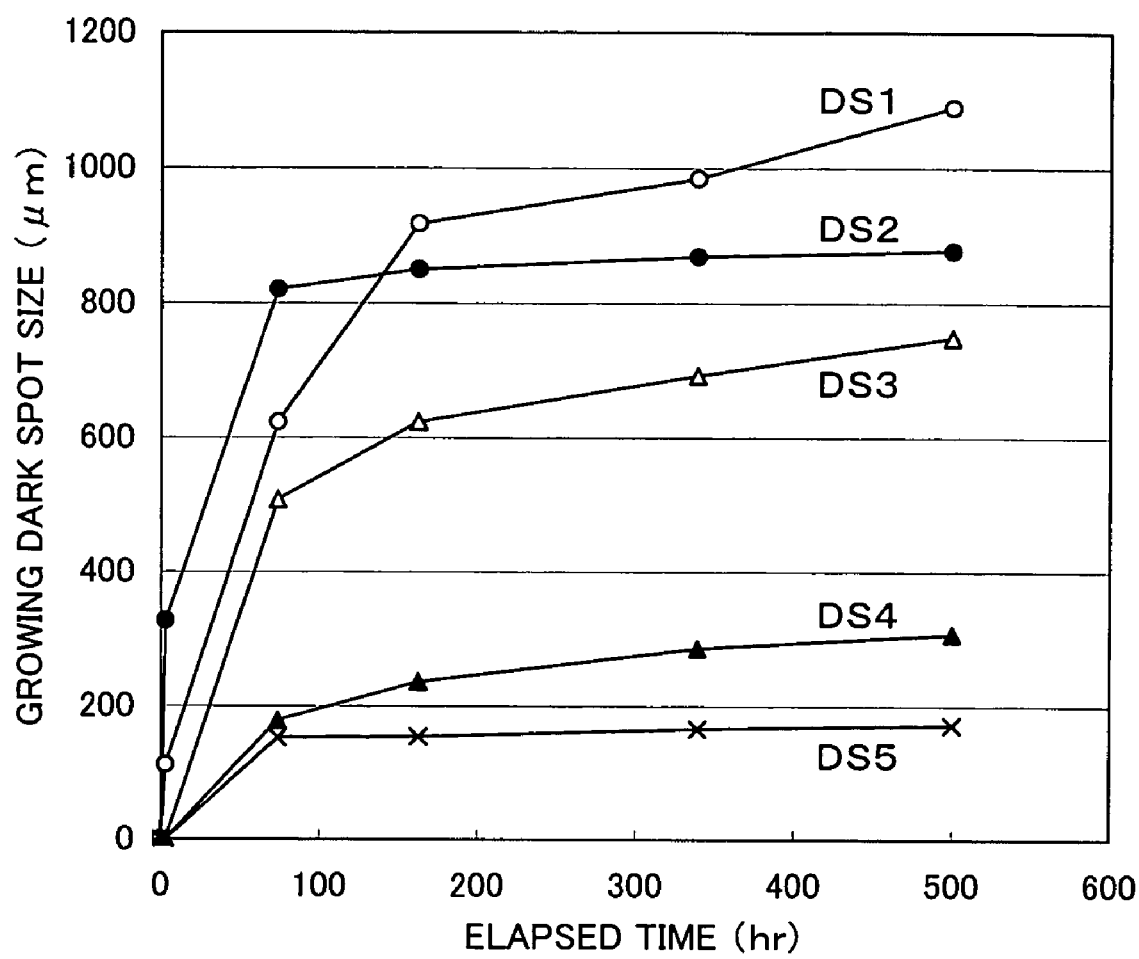
FIG. 3 is a graph illustrating a growing dark spot size with respect to an elapsed time upon effecting an evaluation under high temperature/high humidity conditions on an EL device as a comparative example.

As a comparative example, an EL device was manufactured similarly to the example except that the second protective film was omitted. In other words, the EL element was formed on the glass substrate and then, the first protective film was formed on the surface of the cathode. An evaluation was made of this EL device under the high temperature/high humidity conditions. The evaluation reveals that a number of dark spots glow over time as denoted by samples DS1 to DS5 in FIG. 3.

What is claimed is:

1. An EL device comprising:
   a substrate;
   an EL element formed on a surface of the substrate and including at least a first electrode layer, a light emitting layer, and a second electrode layer;
   a first protective film formed on a surface of the EL element through a dry process to cover the whole of the EL element, the first protective film having a function of avoiding the intrusion of gases and moisture from the outside; and
   a second protective film formed on a surface of the first protective film to cover the whole of the first protective film by using polysilazane applied onto the surface of the first protective film and then baked, the second protective film having a function of avoiding the intrusion of gases and moisture from the outside,
   the second protective film covering any portion of the surface of the EL element not covered by the first protective film.

2. The EL device according to claim 1, wherein the first protective film is formed of one selected from the group consisting of silicon nitride.

3. The EL device according to claim 2, wherein the first protective film has a film thickness of 0.1 to 5 μm.

4. The EL device according to claim 1, wherein the second protective film comprises an $SiO_2$ film.

5. The EL device according to claim 4, wherein the second protective film has a film thickness of 0.01 to 2 μm.

6. The EL device according to claim 1, wherein the EL element comprises an organic EL element.

7. The EL device according to claim 1, wherein the EL device is of a bottom emission type.

8. The EL device according to claim 1, wherein the EL device is of a top emission type.

9. The EL device according to claim 1, wherein the second protective film comprises a $SiO_2$ film including polysilazane or a derivative thereof in an unreacted state.

10. An EL device according to claim 9, wherein the polysilazane derivative is formed by partially replacing hydrogen atoms bonded to Si atoms of polysilazane with alkyl groups each having 1 to 4 carbon atoms.

11. An EL device according to claim 10, wherein the alkyl groups are methyl groups.

* * * * *

UNITED STATES PATENT AND TRADEMARK OFFICE
CERTIFICATE OF CORRECTION

PATENT NO. : 7,170,087 B2  
APPLICATION NO. : 10/891631  
DATED : January 30, 2007  
INVENTOR(S) : Atsushi Kidokoro et al.

It is certified that error appears in the above-identified patent and that said Letters Patent is hereby corrected as shown below:

Column 6, line 34, Claim 2, please delete "The EL device according to claim 1, wherein the first protective film is formed of one selected from the group consisting of silicon nitride." and insert -- The EL device according to claim 1, wherein the first protective film is formed of one selected from the group consisting of silicon nitride, silicon oxynitride, and silicon oxide --.

Signed and Sealed this

Twenty-fourth Day of November, 2009

David J. Kappos  
*Director of the United States Patent and Trademark Office*